United States Patent [19]

Basol et al.

[11] Patent Number: 4,675,468
[45] Date of Patent: Jun. 23, 1987

[54] STABLE CONTACT BETWEEN CURRENT COLLECTOR GRID AND TRANSPARENT CONDUCTIVE LAYER

[75] Inventors: Bulent M. Basol, Los Angeles; Eric S. Tseng, Torrance, both of Calif.

[73] Assignee: The Standard Oil Company, Cleveland, Ohio

[21] Appl. No.: 811,800

[22] Filed: Dec. 20, 1985

[51] Int. Cl.[4] ............ H01L 31/06; H01L 31/18
[52] U.S. Cl. .................. 136/256; 29/572; 29/590; 156/654; 156/659.1; 204/15; 136/260; 357/30; 357/71
[58] Field of Search ............ 136/256, 260; 29/572, 29/590; 204/15; 156/654, 659.1; 357/30, 71

[56] References Cited

U.S. PATENT DOCUMENTS

| 3,112,230 | 11/1963 | Rudenberg | 136/256 |
|---|---|---|---|
| 3,431,150 | 3/1969 | Dolan, Jr. et al. | 148/1.5 |
| 3,880,633 | 4/1975 | Jordan et al. | 65/60.2 |
| 3,902,920 | 9/1975 | Jordan et al. | 136/258 |
| 4,082,569 | 4/1978 | Evans, Jr. | 136/255 |
| 4,084,985 | 4/1978 | Evans, Jr. | 136/251 |
| 4,143,235 | 3/1979 | Duisman | 136/258 |
| 4,159,914 | 7/1979 | Jordan et al. | 136/258 |
| 4,400,244 | 8/1983 | Kroger et al. | 204/2.1 |
| 4,403,398 | 9/1983 | Laurie et al. | 29/572 |
| 4,542,255 | 9/1985 | Tanner et al. | 136/249 |
| 4,586,988 | 5/1986 | Nath et al. | 204/15 |
| 4,595,790 | 6/1986 | Basol | 136/256 |

Primary Examiner—Aaron Weisstuch
Attorney, Agent, or Firm—Joseph G. Curatolo; Larry W. Evans

[57] ABSTRACT

A stable front contact current collector grid 36 is provided for thin-film photovoltaic devices. The current collector grid 36 is deposited on a textured patterned surface 35 of an optically transparent electrically conductive layer 34 that insures stable bonding between the current collector grid 36 and the transparent conductive layer 34. The photovoltaic device 30 includes a substrate 32; an optically transparent electrically conductive layer 34 having a textured patterned surface 35; a front contact current collector grid 36; a first semiconductor layer 38; a second semiconductor layer 40; and an electrically conductive film 42 in contact with the second semiconductor layer.

18 Claims, 5 Drawing Figures

STABLE CONTACT BETWEEN CURRENT COLLECTOR GRID AND TRANSPARENT CONDUCTIVE LAYER

FIELD OF THE INVENTION

This invention relates to an electrodeposited front contact current collector grid for a thin-film photovoltaic device and a method of making a stable bond between such a grid and a transparent conductive layer.

BACKGROUND OF THE INVENTION

Photovoltaic devices utilize specific conductivity characteristics of materials generally referred to as semiconductors, whereby solar energy or radiation is converted to useful electrical energy. This conversion results from the absorption of photon energy in the active region of the cell, whereby some of the absorbed energy causes the generation of electron-hole pairs. The energy required for the generation of electron-hole pairs in a semiconductor material is referred to as the band gap energy and generally is the minimum energy required to excite an electron from the valence band to the conduction band.

There are two principal measures of the utility of photovoltaic devices. First is the efficiency of the device, which is an ascertainable percentage of the total photon energy converted to useful electrical energy. High efficiency photovoltaic devices made of crystalline materials maximize efficiency by minimizing internal lattice defects. The second measure of the utility of a photovoltaic device is its cost. Single crystal devices are complex and costly to produce, and do not readily lend themselves to high volume production.

One approach to reducing the cost of photovoltaic devices is to utilize polycrystalline thin film materials and a heterojunction. A heterojunction refers to the active junction formed at the interface between two dissimilar materials, such as cadmium sulfide and cadmium telluride as taught by Basol, et al. in U.S. Pat. No. 4, 388,483. Basol, et al. described thin-film heterojunction photovoltaic cells wherein the active layer comprises at least one of the metal elements of Class IIB of the Periodic Table of Elements and one of the nonmetal elements of Class VIA of the Periodic Table of Elements. One feature of such photovoltaic devices is the use of extremely thin film active layers. As an example, Basol, et al. utilized a cadmium sulfide layer on the order of 0.02–0.05 micrometer thick and a cadmium telluride layer on the order of about 1.3 micrometers thick. While such economy of material has obvious advantages, it has also presented an unexpected concern with respect to current collection.

Such thin film photovoltaic devices typically comprise an optically transparent substrate through which radiant energy enters the device, a first semiconductor layer formed on the transparent substrate, a second semiconductor layer of opposite conductivity type than the first semiconductor layer forming a junction with the first layer, and a conductive film back contact. When the substrate is not electrically conductive, then a transparent electrically conductive film is disposed between the substrate and the first semiconductor layer so as to function as a front contact current collector; this front contact generally is a layer of a transparent conductive oxide. Transparent conductive oxides, such as indium tin oxide, indium oxide, zinc oxide, and tin oxide are not efficient current collectors in cells of any appreciable size, that is, greater than about one square centimeter, due to their inherent resistivity, which is on the order of about 10 ohms per square. The transparent conductive layer must be supplemented with more efficient current collection means such as a front contact current collector grid. This grid comprises a network of relatively low resistivity material that collects electrical current from the transparent conductive layer and efficiently channels the current to a central current collector.

Front contact current collector grids may be formed by various known processes such as vapor deposition and electrodeposition. Electrodeposition processes are especially preferred since, when coupled with masking techniques, are simple, cost effective techniques adaptable to scale-up.

Front contact current collector grids are generally made of materials such as copper, gold, and silver. Since the grid material is not optically transparent, the presence of the grid will lower the overall efficiency of the photovoltaic device. To minimize this disadvantage, current collector grids are designed to cover as little active surface area as possible. One way in which this is done is by forming extremely narrow gridlines in relation to the active surface area of the photovoltaic device.

Generally, a front contact current collector grid is deposited onto a transparent conductive layer and followed by subsequent depositions of the active semiconductor layers. This procedure has several drawbacks when applied to the formation of a front contact current collector grid by electrodeposition. One such drawback is the tendency of the current collector grid material to separate from the transparent conductive layer. If the gridline has a relatively large thickness, inherent stresses may favor separation of the gridlines from the transparent conductive layer to relieve such stresses. This separation may be aggravated by the subsequent processing steps used to form the photovoltaic device, especially by subsequent electrodeposition and heat treatment process steps. Such separation of the current collector grid from the transparent conductive layer may also occur with time, which is an undesirable occurrence in photovoltaic devices intended to function for on the order of about twenty years.

What is needed in the area of efficient current collection in thin film photovoltaic devices is a stable bond between the electroplated front contact current collector grid and the transparent conductive layer that does not give rise to the above-described drawback.

It is therefore one object of the present invention to provide an electroplated front contact current collector grid for photovoltaic devices, which current collector grid is not accompanied by the above-identified shortcomings.

It is another object of the present invention to provide a photovoltaic device having a stable electroplated front contact current collector grid incorporated therein.

It is yet another object of the present invention to provide a method for the formation of a photovoltaic device that has a stable electroplated front contact current collector grid incorporated therein.

These and additional objects of the present invention will become apparent to one skilled in the art from the below description of the invention and the appended claims.

SUMMARY OF THE INVENTION

The present invention relates to a photovoltaic device having an optically transparent substrate through which radiant energy enters the device, a layer of an optically transparent electrically conductive material deposited onto the substrate, a front contact current collector grid electrodeposited onto the optically transparent electrically conductive layer, a first semiconductor layer deposited onto the optically transparent electrically conductive layer and the front contact current collector grid, a second semiconductor layer contiguous to the first semiconductor layer, and an electrically conductive film disposed on the second semiconductor layer to form an electrical contact therewith; the improvement comprising an etched, patterned, surface on the optically transparent electrically conductive layer which enhances the bond between the optically transparent electrically conductive layer and the front contact current collector grid.

The present invention also relates to a process for forming a photovoltaic device, which process comprises:

(a) depositing a layer of an optically transparent electrically conductive material onto an optically transparent substrate;

(b) etching the surface of the optically transparent electrically conductive layer so as to define a current collector grid pattern;

(c) electrodepositing electrically conductive material onto the etched, patterned surface to form a front contact current collector grid thereon;

(d) depositing a first semiconductor layer onto the optically transparent electrically conductive layer and the current collector grid;

(e) depositing a second semiconductor layer of opposite conductivity onto the first semiconductor layer; and (f) depositing an electrically conductive film over the second semiconductor layer to provide an electrical contact therewith.

DETAILED DESCRIPTION OF THE INVENTION

As used herein, reference is made to large-area, thin film photovoltaic devices. Such photovoltaic devices are characterized as having an exposed active surface area of at least one square centimeter, combined semiconductor layer thicknesses of less than about two micrometers, and comprising semiconductor layers of differing conductivity types. Examples of combinations of such semiconductor layers include CdTe/CdS, HgCdTe/CdS, Cu$_2$S/CdS, CuInSe$_2$/CdS, ZnTe/CdS, and ZnTe/CdSe. Preferably, the semiconductor layer combinations include individual layers wherein each layer comprises at least one of the metal elements of Group IIB of the Periodic Table of Elements and one of the non-metal elements Group VIA of the Periodic Table of Elements, such as CdS, CdTe and HgCdTe.

The front contact current collector grid consists of an electrically conductive material such as copper, gold, silver, nickel, and, as described in copending patent application U.S. Ser. No. 687,079 (now U.S. Pat. No. 4,595,790) entited "Method of Making Current Collector Grid and Materials Therefor", may also be indium, cadmium, tin, lead, zinc, and mixtures, and alloys thereof, as well as mixtures and alloys of any of the above. Preferably a front contact current collector grid of this invention comprises an element selected from the group consisting of copper, gold, silver, nickel, and mixtures and alloys thereof. Most preferably the current collector grid of this invention is copper.

While the invention will be described below as utilizing cadmium sulfide and cadmium telluride semiconductor layers, such embodiment is not to be regarded as limitative. The invention can be utilized in any semiconductor photovoltaic device wherein a current collector grid is incorporated as a front contact, and has special applicability in a photovoltaic device manufactured by electrodeposition processes.

U.S. Pat. No. 4,388,483 to Basol, et al. incorporated herein by reference, teaches a thin film photovoltaic device having an n-type semiconductor layer of cadmium sulfide and a p-type semiconductor layer of cadmium telluride. Light enters such a cell through a transparent substrate and passes therethrough into the cadmium sulfide layer, then into the cadmium telluride layer. Since the cadmium sulfide layer attendates light reaching the cadmium sulfide/cadmium telluride heterojunction, it is desirable to provide a very thin cadmium sulfide layer, in the range of from about 0.01 micrometer to about 0.1 micrometer in thickness. The cadmium telluride layer is an efficient absorber of light and does not require a thickness of more than about 1.2 micrometers to effectively utilize about all of the usable solar spectra which enters.

The cadmium sulfide layer is contiguous to a layer of an optically transparent electrically conductive material such as indium tin oxide that is disposed between the cadmium sulfide layer and the transparent substrate. To enhance the current collection of the optically transparent, electrically conductive layer, a current collector grid is utilized. This front contact current collector grid may have any geometry that allows efficient current collection. Preferably the grid comprises narrow strips so as to permit the maximum amount of solar radiation to enter the cell. Because the grid is narrow, each strip has a relatively large thickness so that the grid achieves a low resistivity compared to the transparent conductive layer. The typical thickness of such a grid is generally from about 0.5 micrometers to about 10 micrometers, depending on the material used for the grid and the width of the grid.

However, as discussed above, this preferred geometry produces inherent stresses that may induce the current collector grid to separate from the transparent conductive layer. These stresses may not manifest themselves immediately, but may, over a period of time, cause the separation between the current collector grid and the transparent conductive layer.

The separation of the current collector grid from the transparent conductive layer is due to relatively weak bonding therebetween. caused in part by a transparent conductive layer surface that has been exposed to the atmosphere for a period of time to become relatively unreactive.

In accordance with the present invention, the bond between the transparent conductive layer and the current collector grid is improved by first etching the surface of the transparent conductive layer in those areas that define the intended pattern of the current collector grid. Such etching improves the mechanical bonding of the current collector grid as it is formed onto the transparent conductive layer as well as exposing a chemically reactive surface for bonding.

The transparent conductive layer is etched only in that area that defines the pattern for the current collector grid. In this way, the current collector grid material is bonded tightly to the transparent conductive layer when it is deposited thereon to insure intimate physical and electridal contact with the transparent conductive layer.

The present invention also provides a method of making a photovoltaic device, which method includes depositing a layer of an optically transparent electrically conductive material onto a transparent substrate. The transparent conductive layer may be formed by any known process, such as vapor deposition, electrodeposition and the like. The thickness of the transparent conductive layer generally ranges from about 0.05 micrometer to about one micrometer.

The transparent conductive layer is then treated in such a manner that the surface is etched in a pattern that anticipates the desired grid pattern to be deposited thereon. The surface maybe etched by chemical etching, or by scribing, such as mechanical, laser, and water scribing, of by other means obvious to one skilled in the art. Preferably, the etched pattern is produced on the surface of the transparent conductive layer by means of chemical etching.

In order to obtain the desired etched grid pattern on the surface of the transparent conductive material, a mask, such as a photoresist mask, may first be printed onto the transparent conductive layer. Those portions of the transparent conductive layer not covered by the mask may then be etched to form the desired grid pattern.

In accordance with the present invention, only the surface portion of the transparent conductive layer is etched. By surface is meant less than about ten percent of the total thickness of the transparent conductive layer. As an example, if an etched pattern is imprinted on the transparent conductive layer by means of chemical etching, the etching process may remove or alter from about 0.5 percent to about 10 percent of the thickness of the transparent conductive layer in the patterned portion of that layer.

Once etched, an electrically conductive material is deposited onto the textured patterned surface to form the front contact current collector grid. In this way, it is assured that the current collector grid is in intimate electrical and physical contact with the transparent conductive layer and, due to the etched surface of the transparent conductive layer, possesses an enhanced mechanical and chemcal bond with the transaprent conductive layer.

The following drawings and examples demonstrate the effectiveness of the subject invention. It is to be understood that these drawings and examples are utilized for illustrative purposes only, and are not intended in any way to be limitative of the present invention.

Figure 1:
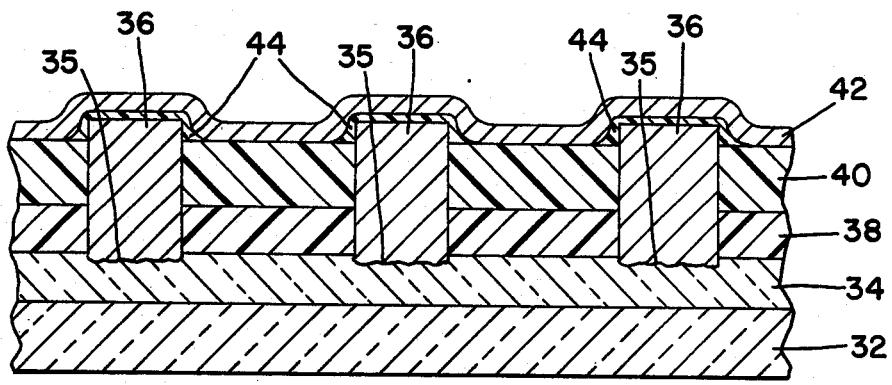
FIG. 1 is a cross-sectional view of a photovoltaic device in accordance with the present invention wherein a front contact current collector grid is deposited onto an etched patterned surface of a transparent conductive layer.

It is noted herein, and appreciated by those skilled in the art that the dimensions of the various features of the figures depicted herein are not drawn to scale with respect to each individual feature. A thin film photovoltaic device may contain active semiconductor layers having comblned thicknesses in the range of from about 1 micrometer to about 10 micrometers, and utilize a front contact current collector grid having a thickness of from about 1 micrometer to about 10 micrometers. It is appreciated that the features in the drawings are depicted for the purpose of clarifying the subject invention.

FIG. 1 depicts a cross-sectional view of a photovoltaic device in accordance with the present invention. As can be seen, the photovoltaic device generally referred to by reference number 30 comprises a transparent substrate 32 through which radiant energy enters the photovoltaic device. An optically transparent electrically conductive material 34 is deposited on the substrate 32. The transparent conductive layer 34 is then selectively etched on its surface as indicated by the reference number 35 to define the anticipated pattern of a current collector grid. The depth of the etching is limited to no more than 10 percent of the total thickness of the transparent conductive layer.

A current collector grid 36 may then be deposited onto the etched, patterned portion of the transparent conductive layer 34. Deposited onto the exposed portion of the transparent conductive layer 34 is a first semiconductor layer 38. Contiguous to the first semiconductor layer 38 is deposited a second semiconductor layer 40 having a conductivity type that is opposite from the conductivity type of first semiconductor layer 38 and forming a junction with the first layer. Alternatively, and preferably, the current collector grid may be deposited in accordance with the disclosure of U.S. Pat. No. 4,595,790 entitled "Method of Making Current Collector Grid and Materials Therefor", wherein the first and second semiconductor layers, 38 and 40 respectively, are first deposited and then etched to form channels therethrough. These channels are then etched into the transparent conductive layer 34 as taught herein to provide an enhanced surface for bonding, and into which channels there is then deposited the front contact current collector grid 36.

An insulating film 44 is deposited over the grid 36 to insure that the front contact 36 is not shorted to a back electrical contact 42. A back electrical contact 42 is disposed over the second semiconductor layer 40 and ohmic contact therewith. This configuration incorporates a front contact current collector grid efficiently bonded to a transparent conductive layer in a thin film photovoltaic device without suffering from the concern that the current collector grid may subsequently separate from the transparent conductive layer.

Figure 2A:
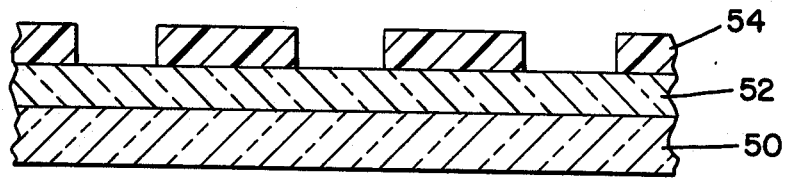
FIG. 2A-D are cross-sectional views of a photovoltaic device showing the step-wise formation of an etched bond between the front contact current collector grid and the transparent conductve layer in accordance with the present invention.

The method of forming a front contact current collector grid onto an etched transparent conductive layer in accordance with the present invention is exemplified in FIGS. 2A-D. One embodiment of this method is shown in these Figures. This embodiment, as shown in FIG. 2A, includes the use of a transparent substrate 50 having an optically transparent electrically conductive film 52 deposited thereo. Onto the transparent conductive film 52 is shown deposited a patterned layer of resist material 54. The resist material 54 is deposited in such a manner as to leave exposed those portions of the transparent conductive layer 52 intended to be etched and which will define the pattern for the current collector grid intended to be utilized in that photovoltaic device.

Figure 2B:
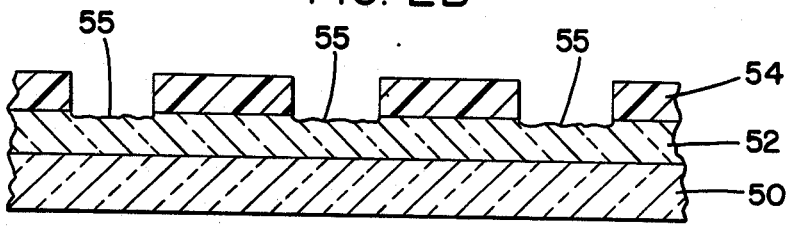

Next, as shown in FIG. 2B. that portion of the transparent conductive layer 52 not masked by resist layer 54 is etched to form a surface more amenable for bonding with the current collector grid. The etched portion of transparent conductive layer 52 is indicated by reference number 55 in FIG. 2B.

Figure 2C:
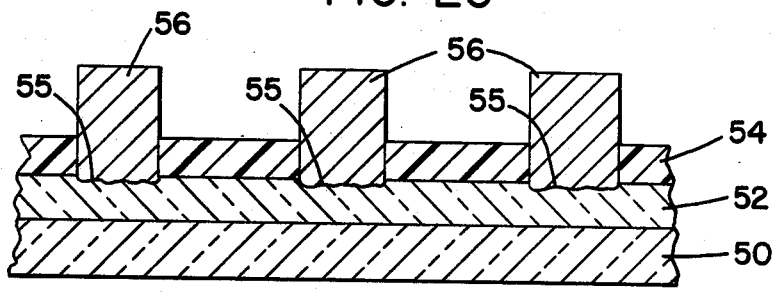

Once the transparent conductive layer has been etched in the pattern desired for the front contact current collector grid, the current collector grid is formed by depositing a conductive material onto the etched portion of the transparent conductive layer. Deposition of the grid material occurs by electrodeposition. As shown in FIG. 2C, the grid 56 has been deposited while the transparent conductive layer 52 remains masked with resist material 54. After formation of the current collector grid 56, the resist mask is removed.

Figure 2D:
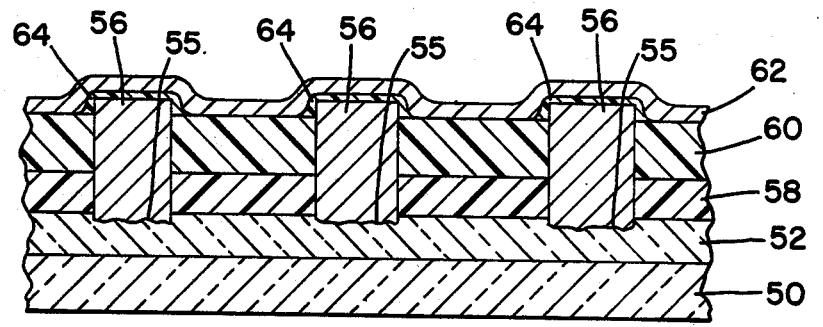

As depicted in FIG. 2D, a first semiconductor layer 58 is then deposited onto transparent conductive layer 52, and a second semiconductor layer 60 is deposited onto the first semiconductor layer. Such layers may be formed by a variety of known methods including those methods taught by Tyan in U.S. Pat. No. 4,207,119 entitled "Polycrystalline Thin-Film CdS/CdTe Photovoltac Cell" and Uda, et al. "All-Screen Printed CdS/CdTe Cell", 16th IEEE Photovoltaic Specialists Conference, Page 801, 1981. An insulating film 64 is deposited over the grid 56 to electrically insulate the grid from a back electrical contact 62 which is deposited onto the second semiconductor layer 60 and is preferably in ohmic contact with the second semiconductor layer 60.

EXAMPLE

A photovoltaic device and method of making in accordance with the subject invention will now be described. The photovoltaic device is similar to that depicted in FIG. 1 and was manufactured in accordance with the processing steps in FIGS. 2A-D, above.

A glass substrate was coated with an about 2400 Angstroms thick layer of indium tin oxide (ITO), an optically transparent electrically conductive material. The ITO was then masked to expose only those portions where the front contact current collector grid would be deposited. The masked ITO was then passed through an aqueous chromic bath, (having about 150 g per liter $CrO_3$ and about 1.5 g per liter concentrated $H_2SO_4$) at a rate of about 0.5 centimeter per second. The temperature of the chromic bath was about 43° C. Chrome was electrically deposited onto the ITO under a constant current of about 15 $mA/cm^2$. Under these conditions, the ITO was etched and chrome was uniformly deposited. Between about 50 and about 100 Angstroms of ITO was etched. This etching both textured the ITO surface where the current collector grid was intended to be formed and also deposited-metal, chrome. that readily bonded with the ITO and also forms an intimate bond with other electrically conductive materials.

The etched and masked ITO was next rinsed and then subjected to a copper bath wherein the current collector grid was formed. The copper bath comprised copper pyrophosphate. Copper was electroplated at a constant current density of about 90 $mA/cm^2$ for an initial 20 seconds and then reduced to about 30 $mA/cm^2$ for about 5 minutes to obtain a current collector grid having a copper thickness of about 5,000 Angtroms.

The photoresist layer was then removed and semiconductor layers of CdS and CdTe, and a back electrical contact of nickel was formed in accordance with the teaching of Basol, et al. in U.S. Pat. No. 4,388.483.

The resultant photovoltaic device, being a CdS/CdTe photovoltaic device, incorporated a copper front contact current collector grid that was well-bonded to the ITO. This photovoltaic device does not suffer from separation of the current collector grid from the transparent conductive layer.

In as much as the present invention is subject to many variations, modifications and changes of detail, a number of which have been expressly stated herein, it is intended that all matter described throughout this specification or shown in the accompanying drawings be interpreted as illustrative and not in a limiting sense. It should thus be evident that a device constructed in accordance with the present invention or a method for the making thereof and reasonable equivalents thereto will accomplish the objects of the present invention. The scope of the invention is intended to include all modifications and variations that fall within the scope of the attached claims.

We claim:

1. A thin film photovoltaic device having an optically transparent substrate through which radiant energy enters the device, a layer of an optically transparent electrically conductive material disposed on said substrate, an electrodeposited front contact current collector grid disposed on the optically transparent electrically conductive layer, a first semiconductor layer disposed on said optically transparent electrically conductive layer in the spaces defined by said current collector grid, a second semiconductor layer, disposed on said first semiconductor layer, and an electrically conductive film disposed on said second semiconductor layer to form an electrical contact therewith, wherein the portion of the surface of the optically transparent electrically conductive layer in contact with said front contact current collector grid is etched to enhance the bond between said optically transparent layer and said current collector grid.

2. The photovoltaic device in accordance with claim 1 wherein said optically transparent substrate is glass.

3. The photovoltaic device in accordance with claim 1 wherein said optically transparent electrically conductive material is selected from the group consisting of indium tin oxide, indium oxide, zinc oxide, and tin oxide.

4. The photovoltaic device in accordance with claim 1 wherein said optically transparent electrically conductive material is indium tin oxide.

5. The photovoltaic device in accordance with claim 1 wherein said front contact current collector grid is made of a material selected from the group consisting of copper, gold, silver, nickel indium, cadmium, tin, lead, zinc, and mixtures and alloys thereof.

6. The photovoltaic device in accordance with claim 1 wherein said front contact collector grid is made of a material selected from the group consisting of copper, gold, silver, nickel, and mixtures and alloys thereof.

7. The photovoltaic device in accordance with claim 1 wherein said front contact current collector grid is made of copper.

8. The photovoltaic device in accordance with claim 1 wherein said first semiconductor layer comprises a compound having a metal element selected from Class IIB and at least one non-metal element selected from Class VIA of the Periodic Table of the Elements.

9. The photovoltaic device in accordance with claim 1 wherein said first semiconductor layer is cadmium sulfide.

10. The photovoltaic device in accordance with claim 1 wherein said second semiconductor layer comprises a compound having a metal element selected from Class IIB and at least one non-metal element selected from Class VIA of the Periodic Table of the Elements.

11. The photovoltaic device in accordance with claim 1 wherein said second semiconductor layer is cadmium telluride.

12. The photovoltaic device in accordance with claim 1 wherein said second semiconductor layer is mercury cadmium telluride.

13. A process for forming a photovoltaic device, which process comprises:
   a. depositing a layer of an optically transparent electrically conductive material onto an optically transparent substrate;
   b. etching the surface of the optically transparent electrically conductive layer so as to define a current collector grid pattern;
   c. electrodepositing electrically conductive material onto the etched patterned surface of the optically transparent electrically conductive layer to form a front contact current collector grid thereon;
   d. depositing a first semiconductor layer onto said optically transparent electrically conductive layer in the spaces defined by said current collector grid;
   e. depositing a second semiconductor layer of opposite conductivity onto said first semiconductor layer; and
   f. depositing an electrically conductive film onto said second semiconductor layer to provide and elctrical contact therewith.

14. The process in accordance with claim 13 wherein said front contact current collector grid is made of a material selected from the group consisting of copper, gold, silver, nickel, indium, cadmium, tin, lead, zinc, and mixtures and alloys thereof.

15. The process in accordance with claim 13 wherein said front contact current collector grid is made of a material selected from the group consisting of copper, gold. silver, nickel, and mixtures and alloys thereof.

16. The process in accordance with claim 13 wherein said front contact current collector grid is made of copper.

17. The process in accordance with claim 13 wherein said surface of the optically transparent electrically conductive layer is etched by chemical etching.

18. The process in accordance with claim 13 wherein prior to step (b), a mask is deposited onto the surface of the optically transparent electrically conductive layer so as to define a current collector grid pattern.

* * * * *